(12) United States Patent
Yoshikawa et al.

(10) Patent No.: US 7,553,787 B2
(45) Date of Patent: Jun. 30, 2009

(54) ALUMINUM NITRIDE-BASED CERAMIC SINTERED BODY AND MEMBER FOR SEMICONDUCTOR MANUFACTURING DEVICE

(75) Inventors: Jun Yoshikawa, Champaign, IL (US); Yoshimasa Kobayashi, Nagoya (JP); Naomi Teratani, Nagoya (JP)

(73) Assignee: NGK Insulators, Ltd., Nagoya-shi (JP)

( * ) Notice: Subject to any disclaimer, the term of this patent is extended or adjusted under 35 U.S.C. 154(b) by 0 days.

(21) Appl. No.: 11/612,016

(22) Filed: Dec. 18, 2006

(65) Prior Publication Data
US 2007/0142205 A1 Jun. 21, 2007

(30) Foreign Application Priority Data
Dec. 19, 2005 (JP) ............................. 2005-364882
Dec. 6, 2006 (JP) ............................. 2006-329776

(51) Int. Cl.
*C04B 35/581* (2006.01)
(52) U.S. Cl. ..................................... 501/98.4
(58) Field of Classification Search ................. 501/98.4
See application file for complete search history.

(56) References Cited

U.S. PATENT DOCUMENTS

| | | | | |
|---|---|---|---|---|
| 4,980,173 A | * | 12/1990 | Halskov | ...................... 424/490 |
| 6,239,402 B1 | | 5/2001 | Araki et al. | |
| 6,900,149 B1 | * | 5/2005 | Ito et al. | ...................... 501/98.4 |
| 6,919,286 B2 | * | 7/2005 | Yoshikawa et al. | ......... 501/98.4 |
| 6,964,812 B2 | * | 11/2005 | Ito et al. | ...................... 428/408 |
| 7,015,166 B2 | * | 3/2006 | Ito et al. | ...................... 501/98.4 |
| 2003/0130106 A1 | * | 7/2003 | Yoshikawa et al. | ......... 501/98.4 |
| 2004/0222211 A1 | * | 11/2004 | Hiramatsu et al. | ....... 219/444.1 |
| 2005/0238859 A1 | * | 10/2005 | Uchimaru et al. | ........... 428/209 |

FOREIGN PATENT DOCUMENTS

| | | | |
|---|---|---|---|
| EP | 1254874 | * | 11/2002 |
| JP | 2000-044345 A1 | | 2/2000 |
| JP | 2003-221279 A1 | | 8/2003 |
| JP | 2003-226580 A1 | | 8/2003 |
| JP | 2003221279 | * | 8/2003 |

OTHER PUBLICATIONS

K. Hara et al., "Combustion Synthesis of Aluminum Nitride Phosphors," Proceedings: EL2004; pp. 24-27.

* cited by examiner

*Primary Examiner*—Karl E Group
(74) *Attorney, Agent, or Firm*—Burr & Brown

(57) ABSTRACT

An aluminum nitride-based ceramic sintered body is provided, which is manufactured by sintering an aluminum nitride powder comprising aluminum nitride as a main component, carbon in an amount of 0.1 wt % or more to 1.0 wt % or less, and containing oxygen in an amount that is not greater than 0.7 wt %, wherein carbon and oxygen are dissolved in grains of the aluminum nitride powder. The a-axis length of the lattice constant of the aluminum nitride is in a range of 3.1120 Å or more to 3.1200 Å or less, and the a c-axis length of the lattice constant is in a range of 4.9810 Å or more to 4.9900 Å or less. The volume resistivity of the aluminum nitride-based ceramic sintered body at 500° C. is $10^9$ Ω·cm or more.

2 Claims, 7 Drawing Sheets

US 7,553,787 B2

ALUMINUM NITRIDE-BASED CERAMIC SINTERED BODY AND MEMBER FOR SEMICONDUCTOR MANUFACTURING DEVICE

CROSS REFERENCE TO RELATED APPLICATIONS

This application is based upon and claims the benefit of priority from prior Japanese Patent Application P2005-364882 filed on Dec. 19, 2005, and Japanese Patent Application P2006-329776 filed on Dec. 6, 2006; the entire contents of which are incorporated by reference herein.

BACKGROUND OF THE INVENTION

1. Field of the Invention

The present invention relates to aluminum nitride powder suitable as a member for a semiconductor manufacturing equipment such as a heater material and an electrostatic chuck and a method of manufacturing the aluminum nitride powder.

2. Description of the Related Art

Conventionally, aluminum nitride (AlN) has been widely used as a member for a semiconductor manufacturing equipment such as a heater material for heating a semiconductor wafer and an electrostatic chuck since AlN exhibits high-corrosion resistance to a halogen gas. Meanwhile, aluminum nitride is desired to have high insulating properties when used as a heater material, whereas a volume resistivity of about $10^9$ to $10^{12}$ $\Omega \cdot cm$ when used as a material for an electrostatic chuck. However, since the volume resistivity of aluminum nitride decreases to $10^7$ $\Omega \cdot cm$ or less in a high temperature atmosphere of 500° C. or more, the insulating properties of aluminum nitride cannot be ensured in the high temperature atmosphere. Based on the background, attempts to improve the volume resistivity of aluminum nitride under a high temperature atmosphere by adding MgO or $B_4C$ to aluminum nitride have been made as disclosed in Japanese Patent Application Laid-open Nos. 2000-44345, 2003-221279, and 2003-226580. However, alkaline earth elements (Mg) or Boron (B) may cause contamination of semiconductor wafers. Due to the possibility of such an adverse effect, it is not always desirable to add alkaline earth elements or Boron to aluminum nitride to improve the volume resistivity thereof in a semiconductor manufacturing process.

The present invention has been achieved to solve the above problem, and an object of the present invention is to provide aluminum nitride powder capable of improving the volume resistivity thereof under a high-temperature atmosphere without adding an alkaline earth elements or Boron, and a method of manufacturing the aluminum nitride powder.

SUMMARY OF THE INVENTION

Aluminum nitride powder according to the present invention comprises aluminum nitride as a main component and carbon in an amount of 0.1 wt % or more to 1.0 wt % or less, the length of a-axis of the lattice constant of aluminum nitride being 3.1120 angstroms or more to 3.1200 angstroms or less and the length of c-axis thereof being 4.9810 angstroms or more to 4.9900 angstroms or less. A method of manufacturing aluminum nitride powder according to the present invention comprises a step of increasing the temperature of aluminum nitride together with a metal oxide to 2000° C. or more under a carbon reducing atmosphere.

According to the aluminum nitride powder and the method of manufacturing aluminum nitride powder according to the present invention, since the aluminum nitride powder has a volume resistivity of $10^8$ $\Omega \cdot cm$ or more even under a high-temperature atmosphere of 500° C. or more, the insulating properties thereof under the high-temperature atmosphere can be improved without adding an alkaline earth elements or Boron.

BRIEF DESCRIPTION OF THE DRAWINGS

Exemplary embodiments of the invention will become more fully apparent from the following description and appended claims, taken in conjunction with the accompanying drawings. Understanding that these drawings depict only exemplary embodiments and are, therefore, not to be considered limiting of the invention's scope, the exemplary embodiments of the invention will be described with additional specificity and detail through use of the accompanying drawings in which:

DETAILED DESCRIPTION OF THE INVENTION

[Aluminum Nitride Powder and Manufacturing Method Thereof]

The present inventors have strenuously researched, and consequently found that aluminum nitride having a volume resistivity of $10^{14}$ $\Omega \cdot cm$ or more at room temperature and a volume resistivity of $10^8$ $\Omega \cdot cm$ or more even under a high-temperature atmosphere of 500° C. or more can be manufactured by subjecting aluminum nitride to heat treatment under a nitrogen atmosphere containing carbon monoxide (CO), thereby forming a solid solution of carbon (C) and oxygen (O) within the aluminum nitride. The presence of the solid solution of carbon and oxygen within the aluminum nitride can be estimated based on an increase in lattice constant of the aluminum nitride. The reason why the presence of the solid solution of carbon and oxygen in the aluminum nitride improves the volume resistivity of aluminum nitride under a high-temperature atmosphere has not yet been elucidated at present; however, it is presumed that conductive carriers produced by the solid solution of oxygen are compensated by the solid solution of carbon, thereby reducing the concentration of the carriers in the aluminum nitride.

[Aluminum Nitride Luminescent Material]

Recently, rare earth elements or Manganese doped aluminum nitride are manufactured from aluminum and rare earth elements or a Manganese compound using a manufacturing method referred to as a combustion synthesis method. It is reported that such an aluminum nitride emits visible light under irradiation of ultraviolet rays or electron beam, and that Europium (Eu) or Terbium (Tb) doped aluminum nitride emits green light under irradiation of ultraviolet rays. However, in the case of electron beam excitation, as excitation energy may not conduct efficiently to Europium or Terbium that functions as emission center, the emission of Europium or Terbium doped aluminum nitride differs by excitation means. Therefore, at this stage, there is no report of aluminum nitride that emits green light with one spectrum peak by electron beam excitation.

Figure 4:
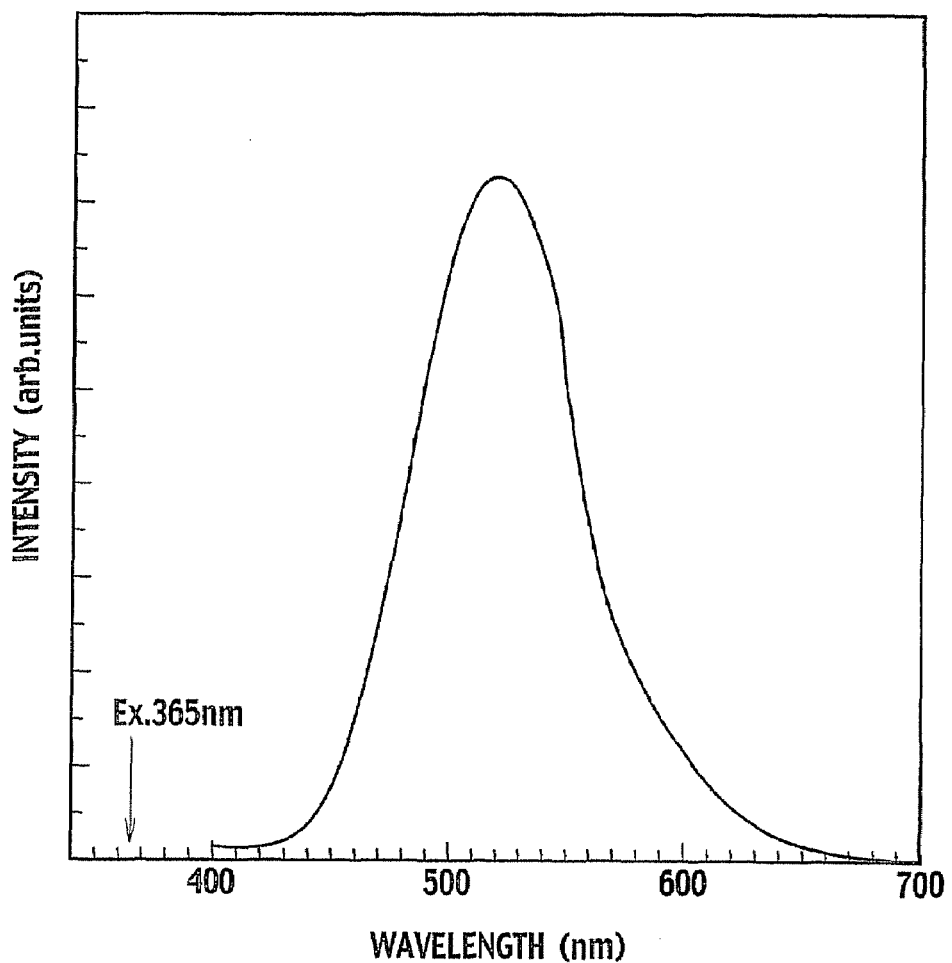
FIG. 4 is photoluminescence spectrum obtained by radiating electromagnetic beam that wavelength is 365 nm on aluminum nitride powder of Example A-1.
Figure 5:
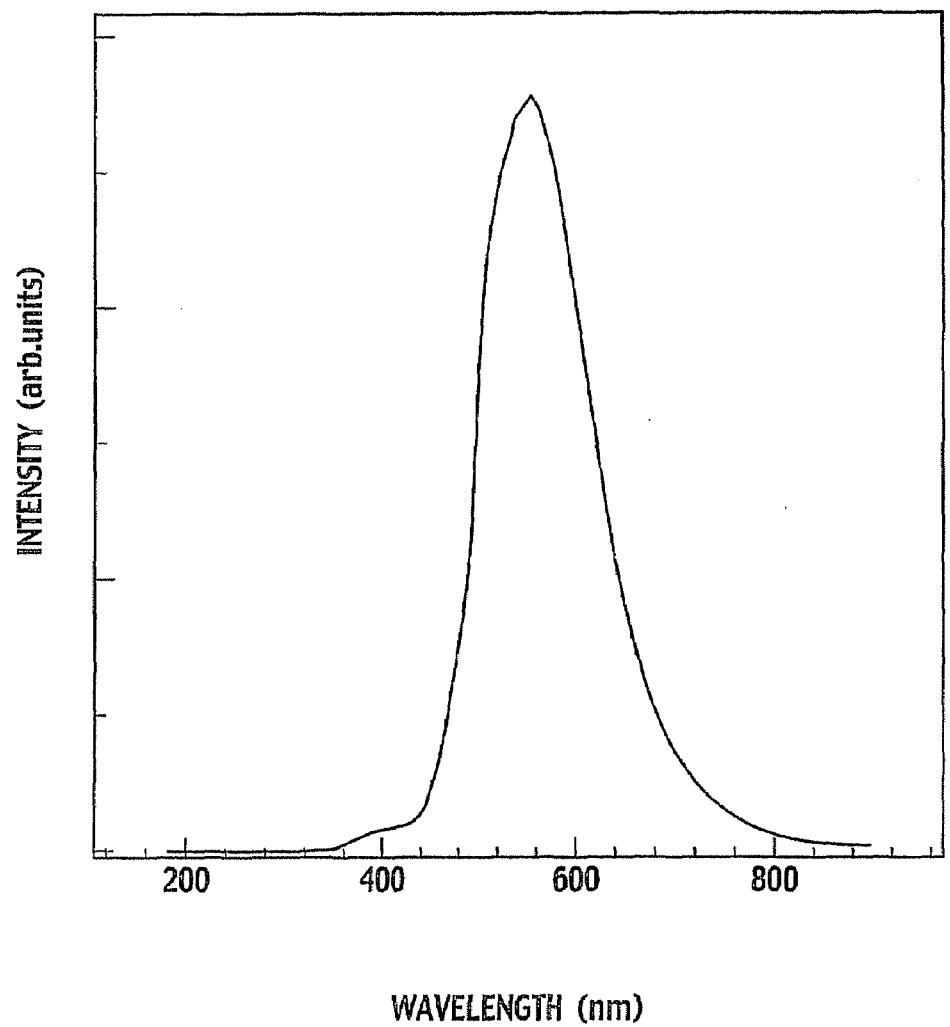
FIG. 5 is cathodeluminescence spectrum obtained by radiating electron beam on aluminum nitride powder of Example A-1.
Figure 6:
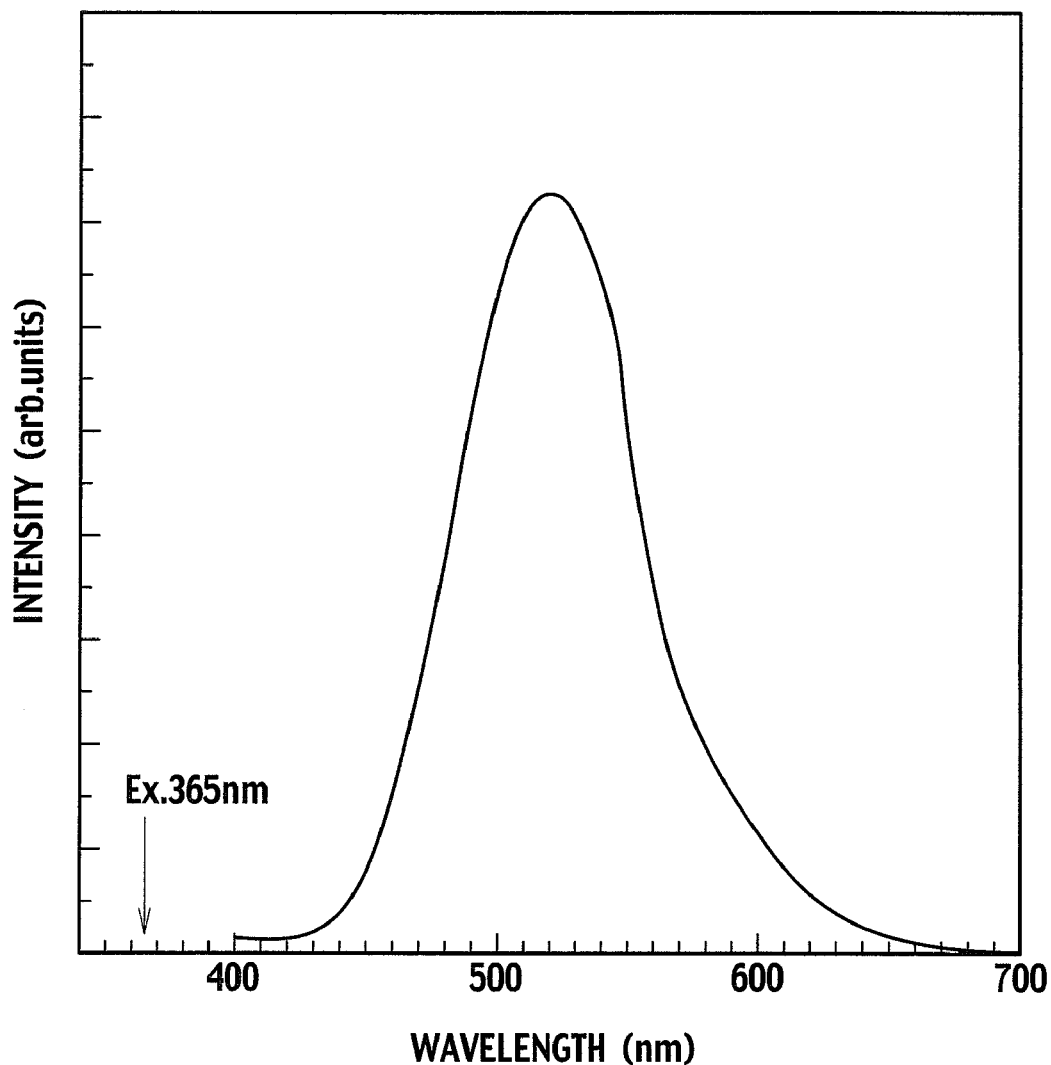
Figure 7:
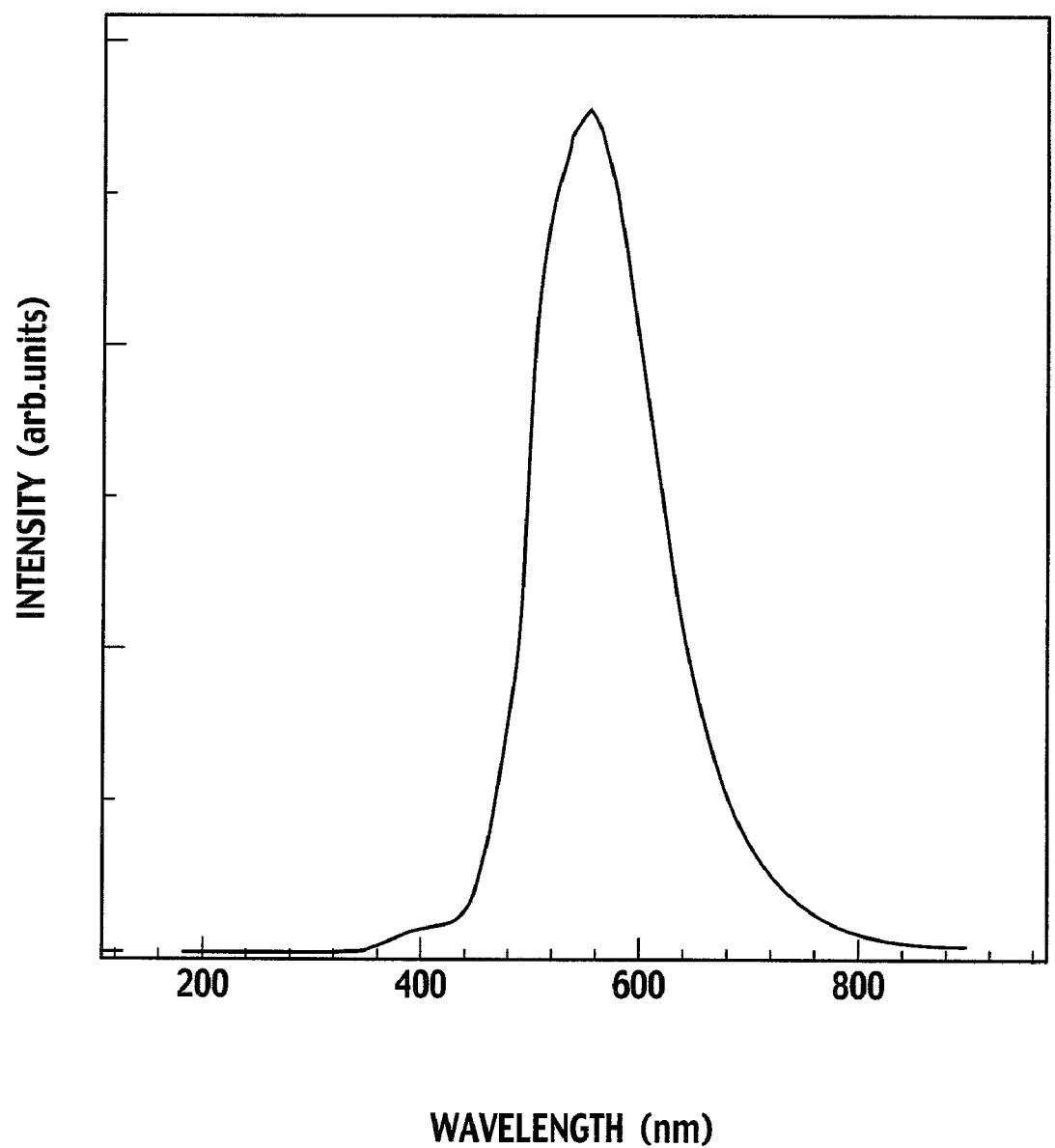

However, as a result of the intensive research conducted by the present inventors, it was found that when carbon and oxygen as impurities are developed into solid solution within aluminum nitride and such aluminum nitride is excited by electromagnetic wave that wavelength is less than 450 nm or electron beam, aluminum nitride emits bluegreen or green light with peak in wavelength range of 480 nm to 560 nm (see FIGS. 4 and 5). According to such an aluminum nitride, aluminum nitride that emits bluegreen or green light efficiently regardless of excitation means and is composed from stable and safe elements, can be provided. Further, since such emission of bluegreen or green light is efficiently excited by light having a wavelength in near-ultraviolet region, it can be excited by Hg emission line and ultraviolet LED used in fluorescent lamps. The specific mechanism of light emission has not yet been elucidated at present; however, it is presumed that this luminescence may be due to level width of carbon and oxygen, the defect level produced by solid solution thereof, and the like.

EXAMPLES

The present invention will be specifically explained below based on Examples.

Example A-1

Figure 1:
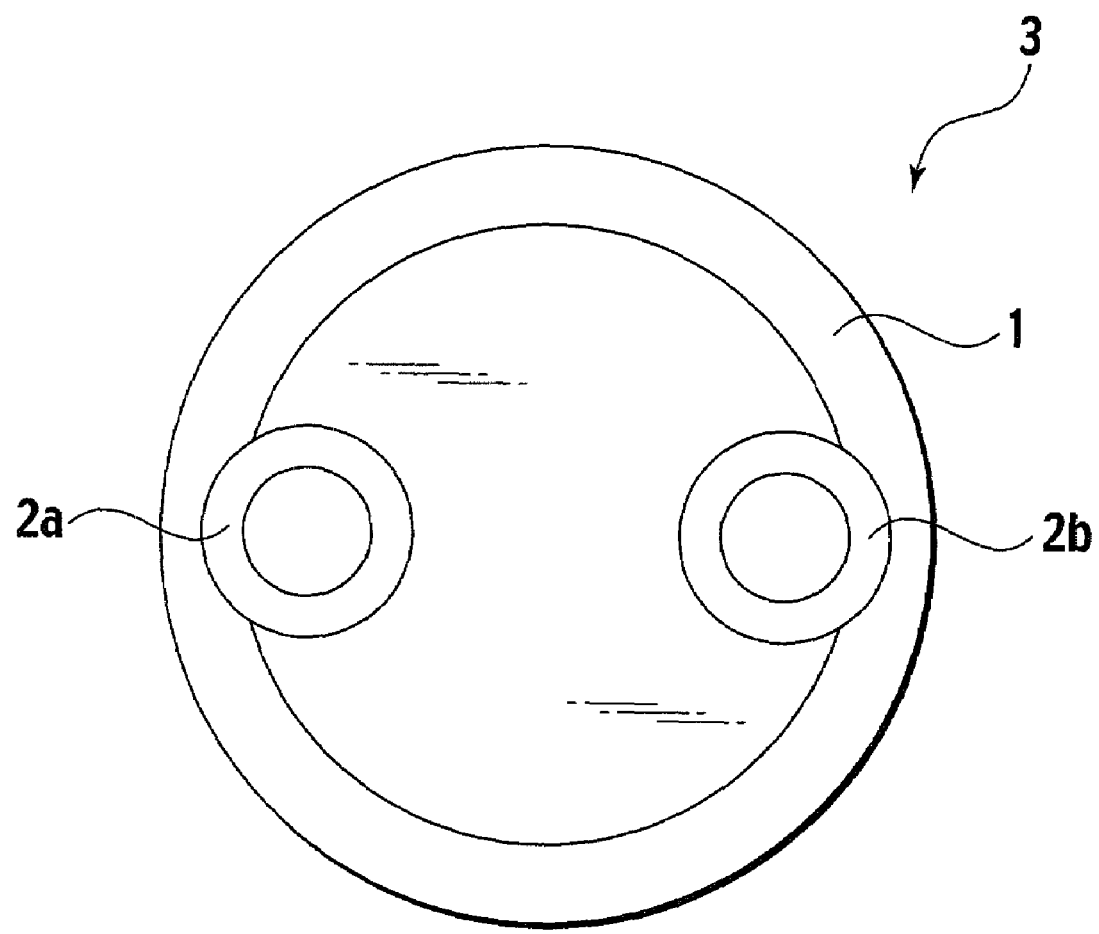
FIG. 1 is a schematic diagram showing a configuration of a crucible used in heat treatment of aluminum nitride.

In Example A-1, 100 g of aluminum nitride (AlN) powder and 2.0 g of aluminum oxide ($Al_2O_3$) powder were placed in graphite crucible 1 and graphite crucibles 2a, 2b, respectively as shown in FIG. 1. Thereafter, the entire crucible 3 shown in FIG. 1 was treated with heat by keeping it in a nitrogen atmosphere containing CO at a temperature of 2200° C. and a pressure of 1.5 $kgf/cm^2$ for 2 hours. In this manner, aluminum nitride powder according to Example A-1 was prepared. The lattice constants (a-axis length and c-axis length) of the aluminum nitride powder of Example A-1 were measured. As a result, the values shown in Table I were obtained. In addition, the contents of oxygen and carbon in the aluminum nitride powder of Example A-1 were measured to obtain the values shown in Table I. The photoluminescence (PL) spectrum obtained by exciting aluminum nitride powder of Example A-1 using ultraviolet rays whose wavelength is 365 nm was measured to obtain the PL spectrum shown in FIG. 4. The cathodeluminescence (CL) spectrum obtained by exciting aluminum nitride powder of Example A-1 using electron beam was measured to obtain the CL spectrum shown in FIG. 5.

The oxygen and carbon contents were quantitatively determined by an inert gas fusion-infrared absorption method and a high frequency heating infrared absorption method, respectively. In this example, as aluminum nitride powder, commercially available reduced nitride powder (oxygen content: 0.9 wt %) was used; however, aluminum nitride powder may be manufactured by any method such as a reduction-nitriding method, a gas phase synthesis method, or a direct nitriding method. Also in this Example, as aluminum oxide powder, commercially available aluminum oxide powder having a purity of 99% or more and an average particle size of 0.6 μm was used; however, metal oxide powder other than aluminum oxide powder may be used as long as it is a metal oxide capable of being reduction-nitrided through heat treatment. The lattice constant of the aluminum nitride powder was determined in accordance with a WPPD (Whole Power Pattern Decomposition) method using aluminum oxide whose lattice constant is known as the internal reference under measurement conditions; CuKαl line source unicolored by a Ge incident monochrometer, an output voltage of 50 kV, an output current of 300 mA, and a scanning angle 2θ=30 to 120°.

The optical properties of aluminum nitride powder were measured as follows. Optical property in the case of ultraviolet rays excitation was measured by using spectrofluorimeter FP-6300 (JASCO Corp.). Specifically, in the measurement, ultraviolet rays having a wavelength of 365 [nm] were radiated on the aluminum nitride powder which is filled in an exclusive-use holder. The wavelength of the PL spectrum was then measured in the range of 400 nm to 700 nm and the wavelength of the spectrum peak was detected. Optical property in the case of electron beam excitation was obtained by measuring the CL spectrum of the aluminum nitride powder due to cathodeluminescence using a type MP-18M-S cathodeluminescence system (JobinYvon Inc.) attached to a scanning electron microscope JSM-6300 (JEOL Ltd.). The measurement conditions were set to an acceleration voltage 20 kv, a probe current of 1 nA and a measurement wavelength range of 180-900 nm.

Example A-2

Figure 2:
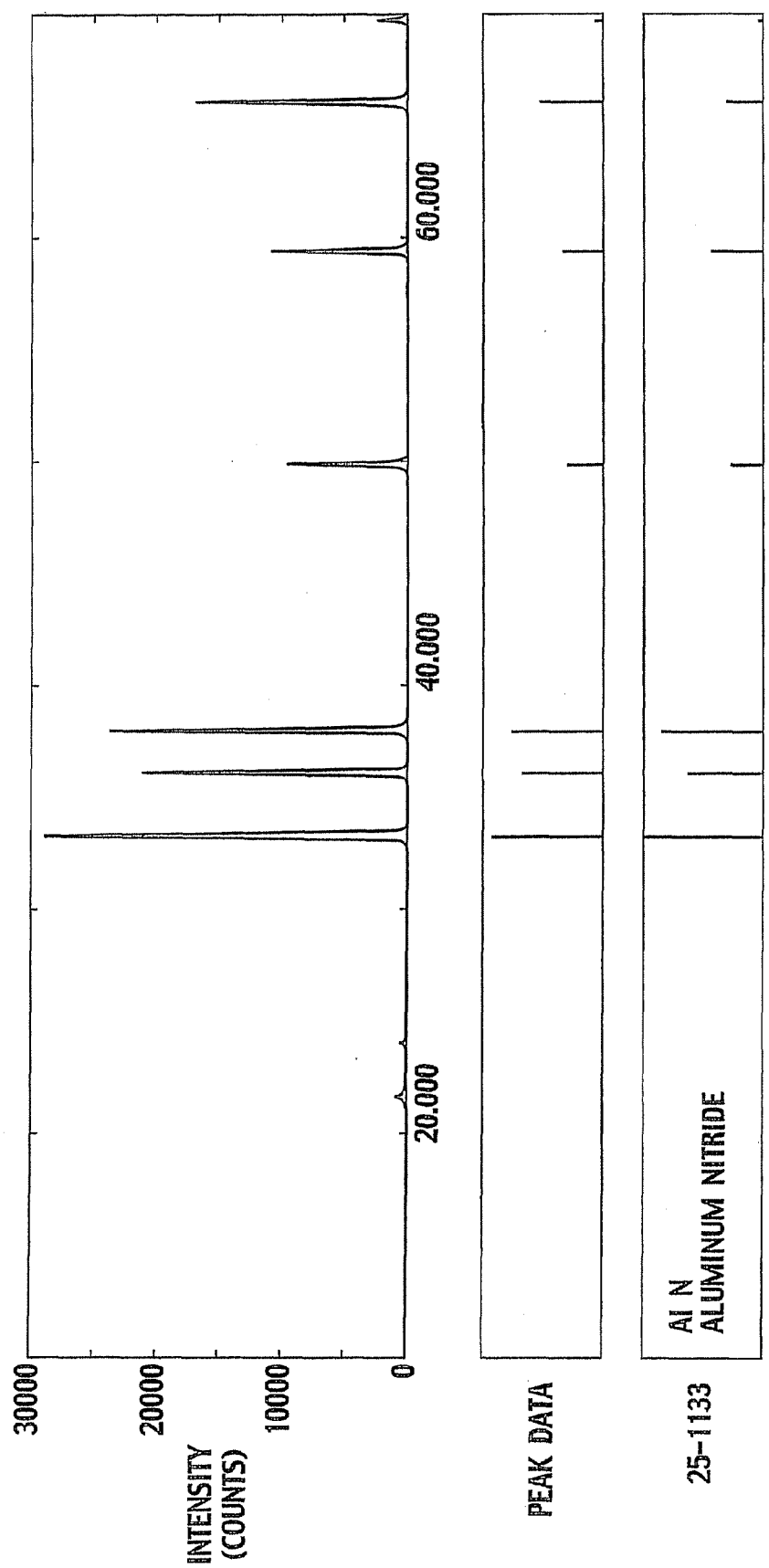
FIG. 2 is an X-ray diffraction pattern of an aluminum nitride powder of Example A-3.

In Example A-2, 100 g of aluminum nitride powder and 2.0 g of aluminum oxide powder were placed in graphite crucible 1 and graphite crucibles 2a, 2b, respectively, as shown in FIG. 1 and thereafter, subjected to the same heat treatment as in Example A-1 except that the heat treatment temperature was set at 2250° C. to prepare the aluminum nitride powder of Example A-2. The lattice constant of the aluminum nitride powder of Example A-2 and the contents of oxygen and carbon thereof were measured. As a result, the X ray diffraction pattern shown in FIG. 2 and the values shown in Table I were obtained.

Example A-3

In Example A-3, 80 g of aluminum nitride powder and 4.0 g of aluminum oxide powder were placed in graphite crucible 1 and graphite crucibles 2a, 2b, respectively, as shown in FIG. 1 and thereafter, subjected to the same heat treatment as in Example A-2 except that keeping time in a nitrogen atmosphere was set as 6 hours to prepare the aluminum nitride powder of Example A-3. The lattice constant of the aluminum nitride powder of Example A-3 and the contents of oxygen and carbon thereof were measured. As a result, the values shown in Table I were obtained.

Example A-4

In Example A-3, 100 g of aluminum nitride powder and 3.0 g of aluminum oxide powder were placed in graphite crucible 1 and graphite crucibles 2a, 2b, respectively, as shown in FIG. 1 and thereafter, subjected to the same heat treatment as in Example A-1 to prepare the aluminum nitride powder of Example A-4. The lattice constant of the aluminum nitride powder of Example A-4 and the contents of oxygen and carbon thereof were measured. As a result, the values shown in Table I were obtained.

Example A-5

In Example A-5, 300 g of aluminum nitride powder and 6.0 g of aluminum oxide powder were placed in graphite crucible 1 and graphite crucibles 2a, 2b, respectively, as shown in FIG. 1 and thereafter, subjected to the same heat treatment as in Example A-1 except that the heat treatment temperature was set at 2150° C. to prepare the aluminum nitride powder of Example A-5. The lattice constant of the aluminum nitride powder of Example A-5 and the contents of oxygen and carbon thereof were measured. As a result, the values shown in Table I were obtained.

Example A-6

In Example A-6, 1000 g of aluminum nitride powder and 20 g of aluminum oxide powder were placed in graphite crucible 1 and graphite crucibles 2a, 2b, respectively, as shown in FIG. 1 and thereafter, subjected to the same heat treatment as in Example A-1 except that the heat treatment temperature was set at 2100° C. to prepare the aluminum nitride powder of Example A-6. The lattice constant of the aluminum nitride powder of Example A-6 and the contents of oxygen and carbon thereof were measured. As a result, the values shown in Table I were obtained.

Example A-7

In Example A-7, 1000 g of aluminum nitride powder and 20 g of aluminum oxide powder were placed in graphite crucible 1 and graphite crucibles 2a, 2b, respectively, as shown in FIG. 1 and thereafter, subjected to the same heat treatment as in Example A-1 except that the heat treatment temperature was set at 2150° C. to prepare the aluminum nitride powder of Example A-7. The lattice constant of the aluminum nitride powder of Example A-7 and the contents of oxygen and carbon thereof were measured. As a result, the values shown in Table I were obtained.

Comparative Example A-1

In Comparative Example A-1, commercially available aluminum nitride powder prepared by a reduction nitriding method was used. The lattice constant of the aluminum nitride powder of Comparative Example A-1 and the oxygen and carbon contents thereof were checked, and the values shown in Table I were obtained.

TABLE 1

|  | Amount of raw material in heat treatment | | Heat treatment condition | Characteristics of AlN powder | | | | |
| --- | --- | --- | --- | --- | --- | --- | --- | --- |
|  | | | | Lattice constant | | Chemical analysis | | Optical characteristic |
|  | Amount of $Al_2O_3$ g | Amount of AlN g | Heat treatment temperature °C. | Length of a-axis Å | Length of c-axis Å | O wt % | C wt % | emission peak wavelength* nm |
| Example A-1 | 2.0 | 100 | 2200 | 3.1122 | 4.9813 | 0.21 | 0.18 | 520 |
| Example A-2 | 2.0 | 100 | 2250 | 3.1124 | 4.9819 | 0.27 | 0.23 | 515 |
| Example A-3 | 1.0 | 80 | 2200 | 3.1154 | 4.9852 | 0.57 | 0.45 | 522 |
| Example A-4 | 3.0 | 100 | 2200 | 3.1126 | 4.9821 | 0.28 | 0.24 | 517 |
| Example A-5 | 6.0 | 300 | 2150 | 3.1130 | 4.9822 | 0.29 | 0.26 | 515 |
| Example A-6 | 20.0 | 1000 | 2100 | 3.1128 | 4.9818 | 0.26 | 0.22 | 509 |
| Example A-7 | 20.0 | 1000 | 2150 | 3.1134 | 4.9830 | 0.37 | 0.32 | 514 |
| Comparative Example A-1 | — | — | No heat treatment | 3.1113 | 4.9804 | 0.85 | 0.03 | — |

*Wavelength of excitation beam: 365 nm

Example B-1

Figure 3:
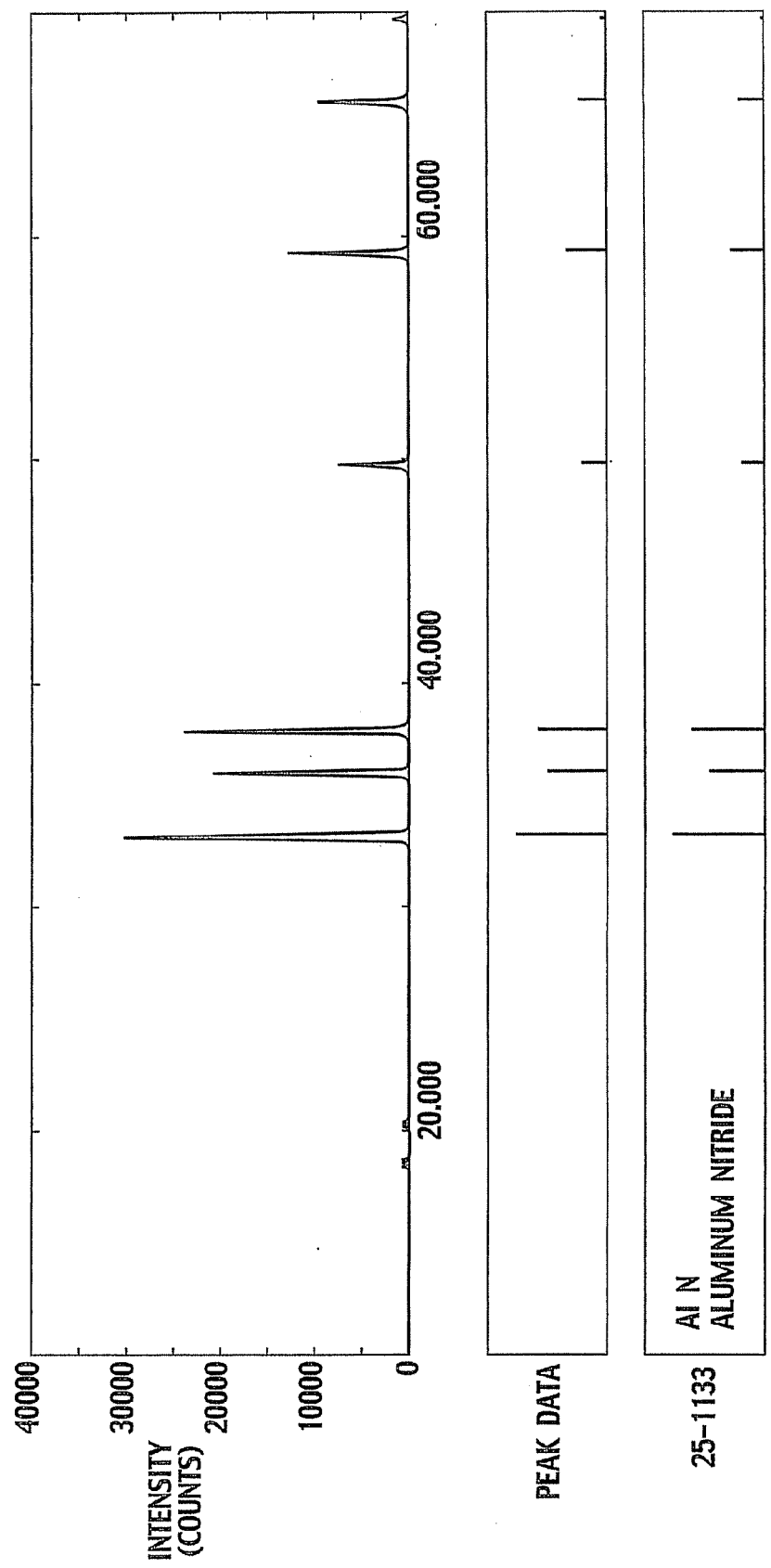
FIG. 3 is an X-ray diffraction pattern of an aluminum nitride-based ceramic sintered body of Example B-1.

In Example B-1, first, aluminum nitride powder according to Example A-1 was pulverized by a ball made of aluminum oxide in wet condition using IPA (isopropyl alcohol) as a solvent, dried, and molded by uniaxial pressing at a pressure of 200 kgf/cm² to obtain a disc-form molded product of 50 mm in diameter (φ) and about 10 mm in thickness. Subsequently, the disc-form molded product was housed in a graphite mold for sintering and maintained at a sintering temperature of 2000° C. for 4 hours while applying a pressure of 200 kgf/cm² by a hot press, and then cooled. In this manner, the aluminum nitride-based ceramic sintered body of Example B-1 was prepared. In this Example, as the atmosphere during the sintering process, a vacuum atmosphere was used in the range of room temperature to 1000° C. and a nitrogen gas atmosphere was used in the range of 1000° C. to the sintering temperature. The lattice constant, volume resistivity and carbon content of the aluminum nitride-based ceramic sintered body of Example B-1 were checked. As a result, the X-ray diffraction pattern shown in FIG. 3 and the values shown in Table II were obtained. The lattice constant and carbon content were checked in the same methods as mentioned above. The volume resistivity was measured by using a test piece of φ50×1 mm, forming electrodes of silver such that a main electrode has 20 mm in diameter, a guard electrode has an inner diameter of 30 mm and an outer diameter of 40 mm, and an application electrode has a diameter of 40 mm, applying a voltage of 500 V/mm, and reading the current one minute after voltage application under vacuum atmosphere at 500° C. by a method in accordance with JIS C2141, followed by performing calculations.

Example B-2

In Example B-2, an aluminum nitride-based ceramic sintered body according to Example B-2 was prepared by applying the same treatment as in Example B-1 except that the aluminum nitride powder of Example A-2 was used. Note that the lattice constant, volume resistivity and carbon content of the aluminum nitride-based ceramic sintered body of Example B-2 were checked. As a result, the values shown in Table II were obtained.

Example B-3

In Example B-3, an aluminum nitride-based ceramic sintered body according to Example B-3 was prepared by applying the same treatment as in Example B-1 except that the aluminum nitride powder of Example A-3 was used. Note that the lattice constant, volume resistivity and carbon content of the aluminum nitride-based ceramic sintered body of Example B-3 were checked. As a result, the values shown in Table II were obtained.

Example B-4

In Example B-4, an aluminum nitride-based ceramic sintered body according to Example B-4 was prepared by applying the same treatment as in Example B-1 except that the aluminum nitride powder of Example A-4 was used. Note that the lattice constant, volume resistivity and carbon content of the aluminum nitride-based ceramic sintered body of Example B-3 were checked. As a result, the values shown in Table II were obtained.

Comparative Example B-1

In Comparative Example B-1, an aluminum nitride-based ceramic sintered body according to Comparative Example B-1 was prepared by applying the same treatment as in Example B-1 except that the aluminum nitride powder of Comparative Example A-1 was used. The lattice constant, volume resistivity and carbon content of the aluminum nitride-based ceramic sintered compact of Comparative Example B-1 were checked. As a result, the values shown in Table II were obtained.

Comparative Example B-2

In Comparative Example B-2, 5 wt % of $Y_2O_3$ was added to the aluminum nitride powder of Comparative Example A-1 and mixed using a pot made of nylon and a ball under wet conditions using IPA (isopropyl alcohol) as a solvent to prepare a slurry. After the slurry was dried and molded by uniaxial pressing at a pressure of 200 kgf/cm² to manufacture a disc-form molded product of 50 mm in diameter (4) and about 10 mm in thickness. The disc-form molded product was then housed in a graphite mold for sintering, and maintained at a sintering temperature of 2000° C. for 4 hours while applying a pressure of 200 kgf/cm² by a hot press and then cooled. In this manner, the aluminum nitride-based ceramic sintered body of Comparative Example B-2 was prepared. The lattice constant, volume resistivity and carbon content of the aluminum nitride-based ceramic sintered compact of Comparative Example B-2 were checked. As a result, the values shown in Table II were obtained.

Comparative Example B-3

In Comparative Example B-3, an aluminum nitride-based ceramic sintered body according to Comparative Example B-3 was prepared by applying the same treatment as in Comparative Example B-2 except that the materials to be added to aluminum nitride were changed to 0.6 wt % of C and 2 wt % of $Y_2O_3$. The lattice constant, volume resistivity and carbon content of the aluminum nitride-based ceramic sintered compact of Comparative Example B-3 were checked. As a result, the values shown in Table II were obtained.

TABLE II

| | | | Sintering condition | Characteristics of AlN based sintered body | | | |
| | | | | Lattice constant | | Volume | Chemical |
| | Raw material AlN | Additive | Sintering temperature ° C. | Length of a-axis Å | Length of c-axis Å | resistivity @ 500° C. Ω cm | analysis C wt % |
|---|---|---|---|---|---|---|---|
| Example B-1 | Example A-1 | Not added | 2000 | 3.1120 | 4.9810 | 2E+09 | 0.18 |
| Example B-2 | Example A-2 | Nat added | 2000 | 3.1123 | 4.9815 | 4E+09 | 0.22 |
| Example B-3 | Example A-3 | Not added | 2000 | 3.1148 | 4.9847 | 3E+11 | 0.43 |
| Example B-4 | Example A-4 | Not added | 2000 | 3.1122 | 4.9817 | 1E+11 | 0.23 |
| Comparative Example B-1 | Comparative Example A-1 | Not added | 1900 | 3.1117 | 4.9783 | 2E+05 | 0.03 |
| Comparative Example B-2 | Comparative Example A-1 | 5 wt % of $Y_2O_3$ | 1900 | 3.1111 | 4.9804 | 5E+07 | 0.02 |
| Comparative Example B-3 | Comparative Example A-1 | 0.6 wt % of C –2 wt % of $Y_2O_3$ | 2000 | 3.1118 | 4.9808 | 6E+06 | 0.57 |

[Evaluation]

The aluminum nitride-based ceramic sintered bodies of Examples B-1, 2, 3, 4 and Comparative Example B-1 were compared with respect to volume resistivity at 500° C., it is apparent that the volume resistivities of the aluminum nitride-based ceramic sintered bodies of Examples B-1, 2, 3, 4 are higher than that of Comparative Example B-1, as shown in Table II. When they are also compared with respect to lattice constant, it is apparent that the lattice constants of the aluminum nitride-based ceramic sintered bodies of Examples B-1, 2, 3, 4 are higher than that of Comparative Example B-1. These results demonstrate that heat treatment of aluminum nitride under a nitrogen atmosphere containing CO allows a solid solution of carbon and oxygen to form in the aluminum nitride, with the result that the volume resistivity thereof improves under a high-temperature atmosphere.

Furthermore, when the aluminum nitride-based ceramic sintered bodies of Examples B-1 and Example B-2 were compared with respect to volume resistivity at 500° C., it is found that the aluminum nitride-based ceramic sintered body of Examples B-2 is higher than that of Example B-1. When they are compared with respect to lattice constant, it is found that the aluminum nitride-based ceramic sintered body of Examples B-2 is larger than that of Example B-1. These results demonstrate that the volume resistivity under a high temperature atmosphere can be much improved by heating aluminum nitride powder at a high temperature.

When the aluminum nitride-based ceramic sintered bodies of Examples B-1, 2, 3, 4 and Comparative Examples B-2, 3 are compared with respect to volume resistivity at 500° C., it is apparent that the volume resistivities of the aluminum nitride-based ceramic sintered bodies of Examples B-1, 2, 3 are higher than those of Comparative Examples B-2, 3, as shown in Table II. Also, when they are compared with respect to lattice constant, it is apparent that the lattice constants of the aluminum nitride-based ceramic sintered bodies of Examples B-1, 2, 3, 4 are larger than those of Comparative Examples B-2, 3. These results demonstrate that carbon is not developed into solid solution within aluminum nitride by simply adding $Y_2O_3$ and C, and therefore the volume resistivity under a high temperature atmosphere cannot be improved.

What is claimed is:

1. An aluminum nitride-based ceramic sintered body, manufactured by sintering an aluminum nitride powder consisting essentially of aluminum nitride as a main component, carbon in an amount of 0.1 wt % or more to 1.0 wt % or less, and oxygen in an amount that is not greater than 0.7 wt %, wherein the carbon and oxygen are dissolved in grains of the aluminum nitride powder, wherein an a-axis length of a lattice constant of the aluminum nitride is in a range of 3.1120 Å or more to 3.1200 Å or less, wherein a c-axis length of the lattice constant is in a range of 4.9810 Å or more to 4.9900 Å or less, and wherein a volume resistivity of the aluminum nitride-based ceramic sintered body at 500° C. is $10^9$ Ω·cm or more.

2. A member for manufacturing a semiconductor, wherein at least one part of the member is formed of the aluminum nitride-based ceramic sintered body according to claim 1.

* * * * *